(12) United States Patent
Liu et al.

(10) Patent No.: US 6,957,400 B2
(45) Date of Patent: Oct. 18, 2005

(54) METHOD AND APPARATUS FOR QUANTIFYING TRADEOFFS FOR MULTIPLE COMPETING GOALS IN CIRCUIT DESIGN

(75) Inventors: Hongzhou Liu, Pittsburgh, PA (US); Rodney Phelps, Pittsburgh, PA (US); Rob A. Rutenbar, Pittsburgh, PA (US)

(73) Assignee: Cadence Design Systems, Inc., San Jose, CA (US)

(*) Notice: Subject to any disclaimer, the term of this patent is extended or adjusted under 35 U.S.C. 154(b) by 160 days.

(21) Appl. No.: 10/652,018

(22) Filed: Aug. 29, 2003

(65) Prior Publication Data

US 2004/0243947 A1 Dec. 2, 2004

Related U.S. Application Data

(60) Provisional application No. 60/474,464, filed on May 30, 2003.

(51) Int. Cl.⁷ .............................................. G06F 17/50
(52) U.S. Cl. .................................. 716/1; 716/2; 716/18
(58) Field of Search ................................. 716/1–2, 4–7, 716/18

(56) References Cited

U.S. PATENT DOCUMENTS

| | | | | |
|---|---|---|---|---|
| 5,281,558 A | * | 1/1994 | Bamji et al. ................... 716/2 |
| 5,481,473 A | * | 1/1996 | Kim et al. ...................... 716/5 |
| 5,805,860 A | * | 9/1998 | Parham ........................ 716/12 |
| 5,880,967 A | * | 3/1999 | Jyu et al. ....................... 716/6 |
| 5,984,510 A | * | 11/1999 | Guruswamy et al. .......... 716/2 |
| 6,035,106 A | * | 3/2000 | Carruthers et al. ............ 703/1 |
| 6,370,677 B1 | * | 4/2002 | Carruthers et al. ............ 716/8 |
| 6,505,327 B2 | * | 1/2003 | Lin ............................... 716/5 |
| 6,560,766 B2 | * | 5/2003 | Pierrat et al. ................ 716/19 |
| 6,625,611 B1 | * | 9/2003 | Teig et al. ................... 707/102 |
| 6,701,306 B1 | * | 3/2004 | Kronmiller et al. ............ 707/2 |
| 2002/0178432 A1 | * | 11/2002 | Kim et al. .................... 716/18 |
| 2004/0044980 A1 | * | 3/2004 | Juengling .................... 716/17 |

OTHER PUBLICATIONS

Krasnicki, M. et al. (1999). "Maelstrom: Efficient Simulation–Based Synthesis for Custom Analog Cells," *Proceedings of the 36th ACM/IEEE Conference on Design Automation*, New Orleans, LA, pp. 945–950.

Phelps, R. et al. (2000). "Anaconda: Simulation–Based Synthesis of Analog Circuits Via Stochastic Pattern Search," *IEEE Transactions on Computer–Aided Design of Integrated Circuits and Systems*(6):703–717.

Zitzler, E. and Thiele L. (1999). "Multiobjective Evolutionary Algorithms: A Comparative Case Study and the Strength Pareto Approach," *IEEE Transactions on Evolutionary Computation*, 3(4):257–271.

* cited by examiner

*Primary Examiner*—Vuthe Siek
*Assistant Examiner*—Naum Levin
(74) *Attorney, Agent, or Firm*—Morrison & Foerster LLP

(57) ABSTRACT

To identify high quality design points in a circuit design, a plurality of design points is generated for the circuit. A subset of the design points is allocated to a design population. A cost is then determined for each allocated design point. From a subset of the allocated design points, a plurality of new design points is generated for the circuit. The cost for each new design point is then determined and each new design point having a cost that is the same or more favorable than the most favorable cost associated with the allocated design points is allocated to the design population. The design points allocated to the design population can then be displayed for selection of one of said allocated design points having desired performances of the circuit.

39 Claims, 10 Drawing Sheets

| DEVICE(S) | | | SYNTHESIZED PERFORMANCE ✶ SPECIFICATION(S) |
|---|---|---|---|
| DEVICE # | DEVICE VARIABLE(S) | DEVICE CONSTANTS(S) | |
| D1 (INPUT TRANSISTOR) | LENGTH & WIDTH | AREA | GAIN (G) |
| D2 (INPUT TRANSISTOR) | = | = | |
| D3 (INPUT TRANSISTOR) | = | = | SLEW RATE (SR) |
| D4 (RESISTOR) | RESISTANCE | LENGTH & WIDTH | |
| D5 (CAPACITOR) | CAPACITANCE | = | UNITY GAIN FREQ (UGF) |
| D6 (RESISTOR) | | = | INPUT OFFSET (IO) |
| D7 (CAPACITOR) | | = | |
| D8 (RESISTOR) | RESISTANCE | | PHASE MARGIN (PM) |

TO FROM A-A

FIG. 2

FIG. 2 CON'T

| | TO FROM A-A | |
|---|---|---|
| D9 (RESISTOR) | = | SETTLING TIME (ST) |
| D10 (RESISTOR) | = | POWER (USAGE) (P) |
| D11 (OUTPUT TRANSISTOR) | LENGTH & WIDTH | AREA |
| D12 (OUTPUT TRANSISTOR) | = | AREA |
| | | ESTIMATED TOTAL AREA (ETA) |

\* PERFORMANCE SPECIFICATIONS TO BE COMPARED TO CIRCUIT PERFORMANCES DETERMINED BY A CIRCUIT SYNTHESIZER

FIG. 3

| DESIGN POINT | CIRCUIT TOPOLOGY | SYNTHESIZED DESIGN POPULATION ↙12 | | | | |
|---|---|---|---|---|---|---|
| | | PERFORMANCE(S) | ORIGINAL COST | DOMINATION COST | TRADEOFF COST | RELATIVE EFFICIENCY |
| DP1 | $T_{DP1}$ | $G_{P-DP1}$<br>$SR_{P-DP1}$<br>$\cdots$<br>$ETA_{P-DP1}$ | $OC_{DP1}$ | $DC_{DP1}$ | $TC_{DP1}$ | $RE_{DP1}$ |
| DP5 | $T_{DP5}$ | $G_{P-DP5}$<br>$SR_{P-DP5}$<br>$\cdots$<br>$ETA_{P-DP5}$ | $OC_{DP5}$ | $DC_{DP5}$ | $TC_{DP5}$ | $RE_{DP5}$ |
| DP7 | $T_{DP7}$ | $G_{P-DP7}$<br>$SR_{P-DP7}$<br>$\cdots$<br>$ETA_{P-DP7}$ | $OC_{DP7}$ | $DC_{DP7}$ | $TC_{DP7}$ | $RE_{DP7}$ |
| $\cdots$ | | | | | | |
| DPX | $T_{DPX}$ | $G_{P-DPX}$<br>$SR_{P-DPX}$<br>$\cdots$<br>$ETA_{P-DPX}$ | $OC_{DPX}$ | $DC_{DPX}$ | $TC_{DPX}$ | $RE_{DPX}$ |

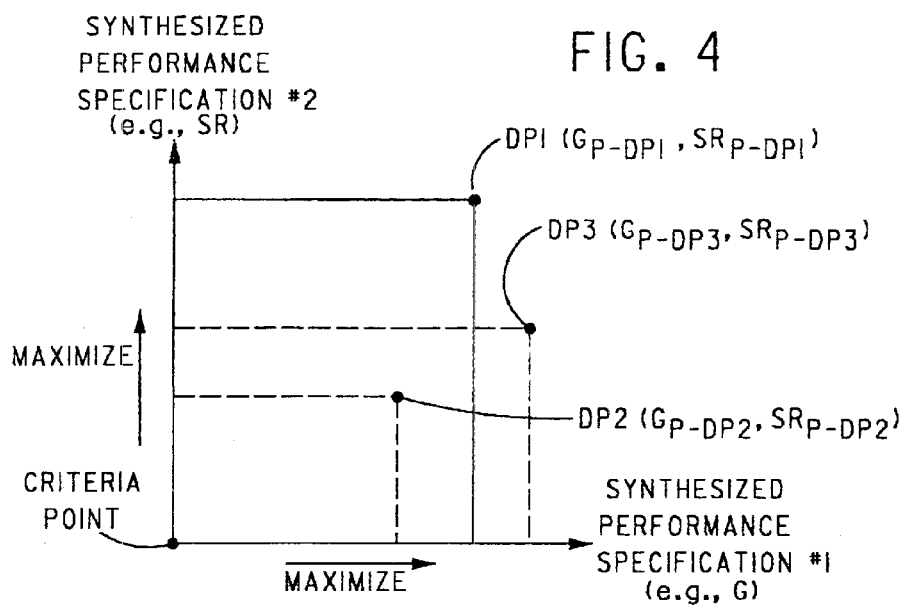
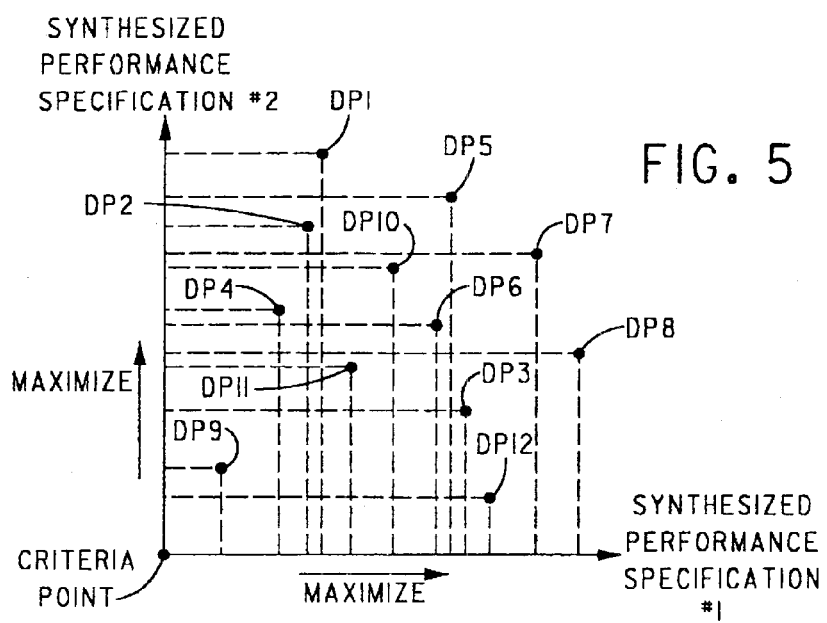

| LAYOUT PERFORMANCE SPECIFICATIONS ✶ |
|---|
| GAIN (G) |
| SLEW RATE (SR) |
| UNITY GAIN FREQ. (UGF) |
| INPUT OFFSET (IO) |
| PHASE MARGIN (PM) |
| SETTLING TIME (ST) |
| POWER (USEAGE) (P) |
| ACTUAL TOTAL AREA (ATA) |
| YIELD ESTIMATE (YE) |
| DESIGN RULE COMPLIANCE (DRC) |

14

✶ PERFORMANCE SPECIFICATIONS TO BE COMPARED TO CIRCUIT PERFORMANCES DETERMINED BY A CIRCUIT SIMULATOR.

| LAYOUT DESIGN POINT | CIRCUIT LAYOUT | LAYOUT DESIGN POPULATION | | | | |
|---|---|---|---|---|---|---|
| | | PERFORMANCE(S) | ORIGINAL COST | DOMINATION COST | TRADEOFF COST | RELATIVE EFFICIENCY |
| LDP1 | $L_{LDP1}$ | $G_{P-LDP1}$<br>$SR_{P-LDP1}$<br>...<br>$DRC_{P-LDP1}$ | $OC_{LDP1}$ | $DC_{LDP1}$ | $TC_{LDP1}$ | $RE_{LDP1}$ |
| LDP5 | $L_{LDP5}$ | $G_{P-LDP5}$<br>$SR_{P-LDP5}$<br>...<br>$DRC_{P-LDP5}$ | $OC_{LDP5}$ | $DC_{LDP5}$ | $TC_{LDP5}$ | $RE_{LDP5}$ |
| LDP7 | $L_{LDP7}$ | $G_{P-LDP7}$<br>$SR_{P-LDP7}$<br>...<br>$DRC_{P-LDP7}$ | $OC_{LDP7}$ | $DC_{LDP7}$ | $TC_{LDP7}$ | $RE_{LDP7}$ |
| ... | | | ... | | | |
| LDPX | $L_{LDPX}$ | $G_{P-LDPX}$<br>$SR_{P-LDPX}$<br>...<br>$DRC_{P-LDPX}$ | $OC_{LDPX}$ | $DC_{LDPX}$ | $TC_{LDPX}$ | $RE_{LDPX}$ |

16

METHOD AND APPARATUS FOR QUANTIFYING TRADEOFFS FOR MULTIPLE COMPETING GOALS IN CIRCUIT DESIGN

CROSS REFERENCE TO RELATED APPLICATIONS

This application claims priority from U.S. Provisional Patent Application No. 60/474,464, filed May 30, 2003.

BACKGROUND OF THE INVENTION

1. Field of the Invention

The present invention relates to circuit design, especially the design of integrated circuits.

2. Description of the Prior Art

Integrated circuit design typically requires several steps: topology selection, sizing of circuit devices that comprise the circuit, and layout of the circuit devices that define the circuit. Topology selection involves choosing an interconnection of circuit devices to implement a desired function. Examples of circuit devices include transistors, resistors, capacitors and the like. Circuit sizing involves the use of a circuit synthesizer for automatically sizing the circuit devices utilizing numerical techniques to search a defined design space. Layout of the circuit devices involves the manual or automated layout of the circuit devices based on the sizes of the circuit devices determined by the circuit synthesizer during sizing of the circuit devices.

Currently, circuit synthesizers are optimization-based and utilize numerical techniques to search a defined design space. A design space is typically comprised of many design points, where a design point is comprised of a topology of the circuit devices for the circuit and the performances associated with the topology. One problem associated with the use of a circuit synthesizer is that the design space for many circuits may contain millions of design points, with industrial circuits containing trillions of design points or more. Because of this huge number of design points, the design space cannot be effectively explored utilizing exhaustive search techniques to evaluate each design point. An intelligent search process is, therefore, necessary to find a design point that meets the user-specified performance specifications and is optimal in terms of area, power, and/or some other measure of merit.

In operation, each design point simulated by a circuit synthesizer is evaluated to determine how far the current design point's performances are from predefined performance specifications for the circuit. The result of this determination is typically called the cost of the design point. Circuit synthesizers are configured to search the design space to find the best design point, i.e., the design point having the smallest cost, that meets the performance specifications. Circuit synthesizers are good at finding the best design point to meet performance specifications. However, circuit synthesizers are not good at finding tradeoff relationships between competing performance specifications. The present invention is targeted at identifying high quality design points wherein tradeoff relationships between competing performance specifications are considered.

SUMMARY OF THE INVENTION

The invention is a method of identifying high quality design points in a circuit design. The method includes defining a plurality of performance specifications for a circuit formed of a plurality of interconnected circuit devices, wherein each performance specification represents a goal for a corresponding performance of the circuit. At least one device variable is defined for at least one of the circuit devices. Subject to each device variable and the performance specifications, a plurality of design points is generated for the circuit wherein each generated design point is comprised of a topology of the circuit devices and the performances associated with said topology. For each design point, an original cost is determined that is related to the degree of correlation between the performance specification and the performances of the circuit associated with the design point. A subset of the design points is then identified. For each identified design point, a domination cost is determined as a function of how favorable at least one performance of the design point is with respect to the corresponding performance of at least one other identified design point. For each identified design point, a tradeoff cost is determined by combining the original cost and the domination cost for the design point. Another plurality of design points is then generated for the circuit subject to the performance specifications and the circuit topology associated with each of a subset of the identified design points. Each thus generated design point is generated from at least one of the subset of identified design points. At least one device variable of each thus generated design point has a value that is different than a value of said device variable for the at least one design point from which said thus generated design point was generated. For each thus generated design point, an original cost is determined that is related to the degree of correlation between the performance specifications and the performances of the circuit topology associated with said design point. In addition, for each thus generated design point, a domination cost is determined as a function of how favorable at least one performance of said generated design point is with respect to the corresponding performance of at least one other generated design point. A tradeoff cost is determined for each thus generated design point by combining the original cost and the domination cost for said thus generated design point. Each thus generated design point that has a tradeoff cost that is the same or more favorable than the most favorable tradeoff cost of the identified design point is identified. If identifying additional design points is desired, the steps of (i) generating another plurality of design points for the circuit, (ii) determining an original cost, a domination cost, and a tradeoff cost for each thus generated design point and (iii) identifying thus generated design points having tradeoff costs that are the same or more favorable than the most favorable tradeoff cost of the identified design point are repeated. Once a sufficient number of design points have been identified, the identified design points can be stored on a computer readable medium for subsequent retrieval and/or display of some or all of said identified design points for selection of one of said identified design points having desired performances for the circuit.

At least one of the foregoing subsets of design points including identified design points can include all of said design points and the most favorable cost can include the lowest cost.

The method can also include, for generated design points that have tradeoff costs that are less favorable than the most favorable tradeoff cost of the identified design points, identifying a subset of said design points utilizing a heuristic. The heuristic can include utilizing a simulated annealing method to identify the subset of design points.

Determining the domination cost for each identified design point can include determining a ratio of the total number of identified design points and the number of identified design points having at least two more favorable performances than said design point. Alternatively, determining the domination cost of each identified design points can include determining a ratio of (i) a distance between at least two performances of said design point and a criteria point representing the smallest or largest permissible values of said two performances and (ii) a distance between the criteria point and a tradeoff frontier defined by the other design point. This ratio can be then subtracted from one (1) to obtain the domination cost.

Determining the domination cost for each generated design point can include determining a ratio of (i) a sum of the total number of identified design points plus the number of generated design points and (ii) the number of design points of said sum having at least two more favorable performances than said generated design point. Alternatively, determining the domination cost for each generated design point can include determining a ratio of (i) a distance between at least two performances of said generated design point and a criteria point representing the smallest or largest permissible values of said two performances and (ii) a distance between a tradeoff frontier defined by the other generated design point and the criteria point. This ratio can be subtracted from one (1) to obtain the domination cost.

One or more of the steps of the foregoing method can be stored as instructions on a computer readable medium. When executed by a processor, these instructions cause the processor to perform the one or more steps.

The method can further include identifying a subset of the identified design points and processing each thus identified design point to generate a layout design point that includes a physical layout of the interconnected circuit devices. The physical layout of interconnected circuit devices associated with each layout design point can be processed to determine performances therefore. A tradeoff cost for each layout design point can be determined based on at least one of (i) a degree of correlation between layout performance specifications for the circuit and the layout performances of the physical layout associated with said layout design point and (ii) how favorable at least one layout performance of said layout design point is with respect to the corresponding layout performance of at least one other layout design point. A subset of the layout design points can be identified based on their tradeoff costs. Another plurality of layout design points can be generated for the circuit, wherein each thus generated layout design point is generated from at least one of the layout design points identified thus far, and a physical layout associated with each thus generated layout design point is different than the physical layout associated with the at least one layout design point from which said thus generated design point was generated. For each thus generated layout design point, the physical layout of interconnected circuit devices associated with said generated layout design point can be processed to determine layout performances therefore. A tradeoff cost for each thus generated layout design point can be determined based on one of (1) a degree of correlation between the layout performance specifications and the layout performances of the physical layout associated with said thus generated layout design point and (2) how favorable at least one layout performance of said generated layout design point is with respect to the corresponding layout performance of at least one other thus generated layout design point. Each thus generated layout design point that has a tradeoff cost that is the same or more favorable than the most favorable tradeoff cost of the already identified design points is identified. If identifying additional layout design points is desired, the steps of (1) generating another plurality of layout design points for the circuit, (2) determining layout performances for each thus generated layout design point, (3) determining tradeoff cost for each thus generated layout design point and (4) identifying each thus generated layout design point that has a tradeoff cost that is the same or more favorable than the most favorable tradeoff cost of the already identified design points are repeated. Once a sufficient number of layout design points have been identified, the identified layout design points can be stored on the computer readable medium for subsequent retrieval and/or display of some or all of said identified layout design points for selection of one of said layout design points having desired performances.

Lastly, the invention is a method of identifying high quality design points that includes generating a plurality of design points for a circuit based on at least one performance specification for the circuit and at least one device variable for at least one circuit device of the circuit. Each design point can include a topology of the circuit devices forming the circuit and performances of the circuit associated with said topology. A subset of the design points can be allocated to a design population. For each allocated design point, a cost can be determined for said design point as a function of (i) a degree of correlation between the performance specifications and the performances of the circuit associated with the design point and/or (ii) how favorable at least one performance of the design point is with respect to the corresponding performance of at least one other allocated design point.

Subject to the performance specifications and the circuit topology associated with each of a subset of the design points allocated to the design population, another plurality of design points for the circuit is generated. For each thus generated design point, a cost is determined for said generated design point as a function of (i) a degree of correlation between the performance specification and the performances of the circuit associated with said generated design point and/or (ii) how favorable at least one performance of said generated design point is with respect to the corresponding performance of at least one other generated design point. Each thus generated design point that has a cost that is the same or more favorable than the most favorable cost of the allocated design points is allocated to the design population. If additional design points are to be allocated to the design population, the steps of (1) generating another plurality of design points, (2) determining the cost for each thus generated design point and (3) allocating to the design population each thus generated design point that has a cost that is the same or more favorable than the most favorable cost of the previously allocated design points are repeated. Once a desired number of design points has been allocated to the design population, the allocated design points can be stored on a computer readable medium for subsequent retrieval and display and/or displayed directly for selection of one of said allocated design points having desired performances for the circuit.

The method can also include, for generated design points that have tradeoff costs that are less favorable than the most favorable tradeoff cost of the allocated design points, allocating a subset of said generated design points to the design population based on a heuristic, such as simulated annealing.

The method can also include identifying a subset of the design points allocated to the design population and processing each thus identified design point to generate a layout design point that includes a physical layout of the interconnected circuit devices. The physical layout of interconnected circuit devices associated with each generated layout design point can be processed to determine layout performances therefore. A cost for each generated layout design point can be determined based on (1) a degree of correlation between layout performance specifications for the circuit and the layout performances of the physical layout associated with said generated layout design point and/or (2) how favorable at least one layout performance of said generated layout design point is with respect to the corresponding layout performance of at least one other generated layout design point. A subset of the generated layout design points can then be allocated to a layout design population and another plurality of layout design points generated for the circuit, wherein each thus generated layout design point is generated from at least one layout design point allocated to the layout design population, and a physical layout associated with each thus generated layout design point is different than the physical layout associated with the at least one generated layout design point from which said thus generated design point was generated. The physical layout of interconnected circuit devices associated with each thus generated layout design point can be processed to determine layout performances therefore. A cost for each thus generated layout design point can be determined based on (i) a degree of correlation between the layout performance specifications and the layout performances of the physical layout associated with said generated layout design point and/or (ii) how favorable at least one layout performance of said generated layout design point is with respect to the corresponding layout performance of at least one other generated layout design point. Each thus generated layout design point that has a tradeoff cost that is the same or more favorable than the most favorable tradeoff cost of the already allocated layout design points is allocated to the layout design population. If allocation of additional layout design points to the design population is desired, the steps of (1) generating another plurality of layout design points (2) determining layout performances for each thus generated layout design point (3) determining a cost for each thus generated layout design point and (4) allocating to the layout design population each thus generated layout design point that has a tradeoff cost that is the same or more favorable than the most favorable tradeoff cost of the already allocated design points are repeated. Once a desired number of layout design points has been allocated to the layout design population, the allocated layout design points can be stored on the computer readable medium for subsequent retrieval and display and/or displayed directly for selection of one of said allocated layout design points having desired performances for the circuit.

BRIEF DESCRIPTION OF THE DRAWINGS

FIG. 2 is a chart of circuit devices, device variables for each circuit device, device constants for each circuit device and performance specifications for the circuit shown in FIG. 1;

FIG. 3 is a synthesized design population matrix showing design points included in a preferred synthesized design population along with the circuit topology, performances, original cost, domination cost, tradeoff cost and relative efficiency for each design point;

FIGS. 4–6 are x-y graphs, where one axis represents one synthesized performance specification of a circuit and the other axis represents another synthesized performance specification of the circuit, including design points positioned in the graph, wherein each design point represents the performances for the design point corresponding to the synthesized performance specifications represented by the axes of the graph;

FIG. 8 is a list of layout performance specifications for a layout of the circuit devices and interconnects of the circuit shown in FIG. 1;

FIG. 9 is a layout design population matrix showing layout design points included in a preferred layout design population along with the circuit layout, performances, original costs, domination costs, tradeoff costs and relative efficiency for each layout design point.

DETAILED DESCRIPTION OF THE INVENTION

The present invention will be described with reference to the accompanying figures where like reference numbers correspond to like elements.

The present invention is a method which is desirably embodied in computer readable program code which executes on a processor of a computer system, e.g., a stand-alone or networked computer or workstation, that includes a computer storage, an input/output system, media drive(s), such as a disk drive, CD ROM drive, etc., and a computer-usable storage medium capable of storing the computer readable program code that embodies the present invention. Under the control of the computer readable program code, the processor is capable of configuring and operating the computer system in a manner to implement the present invention. Computer systems of the type described above are well-known in the art and are not described herein for purpose of simplicity.

Figure 1:
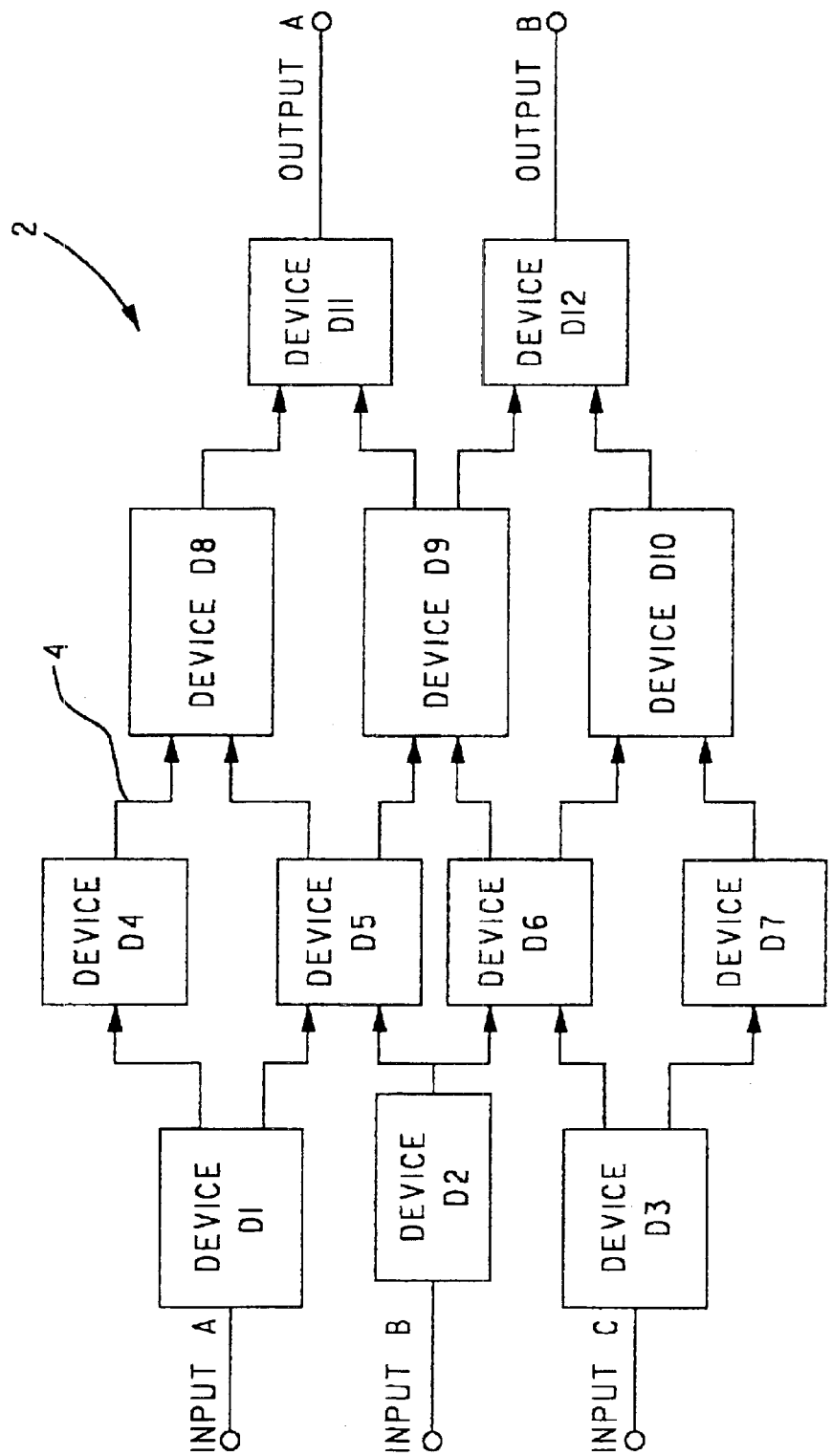
FIG. 1 is a block diagram of a circuit including a set of devices connected by interconnects.

With reference to FIGS. 1 and 2, a circuit 2 is formed from a plurality of circuit devices, e.g., circuit devices D1–D12, connected by one or more interconnects 4. For simplicity of illustration, each circuit device D in FIG. 1 is shown as a block. However, one skilled in the art would readily recognize that each circuit device D is an actual circuit device, such as a transistor, resistor, capacitor, etc. Accordingly, circuit 2 formed from a plurality of blocks indicative of circuit devices D is not to be construed as limiting the invention.

Devices D1–D12 can be any suitable devices. In FIG. 2, devices D1–D3 are designated as input transistors, devices D11 and D12 are designated as output transistors, devices D4, D6 and D8–D10 are designated as resistors and devices D5 and D7 are designated as capacitors. However, this is not to be construed as limiting the invention.

Prior to implementing circuit 2, one or more synthesized performance specifications 6 are defined for circuit 2. Each performance specification 6 represents a goal for a corresponding performance of the circuit to be generated by a circuit synthesizer (discussed hereinafter). Performance specifications 6 for circuit 2 can include, for example, gain (G); slew rate (SR); unity gain frequency (UGF); input offset (IO); phase margin (PM); settling time (ST); power consumption (P); and estimated total area (ETA). Each performance specification 6 can represent a maximum value, a minimum value, or a range of values for the corresponding performance of circuit 2. For example, a performance specification of 60 dB for gain (G) indicates that a minimum (or maximum) gain of 60 dB is required of circuit 2.

As shown in FIG. 2, each device D can include one or more device variables 8 and/or one or more device constants 10. For example, input transistor D1 can have device variables length and width and a device constant of area; resistor D4 can have device constants length and width and a device variable of resistance; resistor D8 can have device variable resistance and no device constant; and output transistor D12 can have device variables length and width and a device constant of area. The listing of device variables and device constants in FIG. 2 is for the purpose of illustration and is not to be construed as limiting the invention.

Once defined, the device variables 8, the device constants 10, and the performance specifications 6 for circuit 2 are input into a circuit synthesizer (not shown) which generates therefrom a plurality of design points for circuit 2. Ordinarily, a circuit synthesizer processes each device variable, each device constant, and the performance specifications 6 to find an "optimal" design point. During such processing, however, the circuit synthesizer generates a plurality of sub-optimal design points and utilizes these sub-optimal design points to guide its search for the "optimal" design point. However, since a circuit synthesizer is not configured to account for tradeoff(s) between competing performances of the circuit, the "optimal" design point output by a circuit synthesizer may, in fact, not be optimal in terms of such tradeoff(s). Accordingly, in accordance with the present invention, the circuit synthesizer is configured to output a plurality of these sub-optimal design points during processing to find the "optimal" design point.

With reference to FIG. 3 and with continuing reference to FIGS. 1 and 2, each design point DP output by the circuit synthesizer includes, among other things, a topology T of the circuit devices defining the circuit and the performances associated with said topology T. For example, design point DP1 includes circuit topology $T_{DP1}$ and performances $G_{P-DP1}$, $SR_{P-DP1}$, . . . , $ETA_{P-DP1}$ corresponding to like performance specifications 6 for the circuit shown in FIG. 2. The circuit topology T of each design point DP includes an interconnection of the circuit devices D for the circuit, wherein each circuit device D of the circuit topology T has a specific, or fixed geometry, e.g., length and width, associated therewith. Each circuit topology T, however, does not include a layout of the circuit devices D and the interconnects. Rather, the layout of the circuit devices D associated with a design point DP occurs after the design point DP has been selected by a designer from a design population to be described hereinafter. FIG. 3 shows a synthesized designer population matrix 12 wherein each row represents one of the design points DP generated by the circuit synthesizer that has been allocated thereto. For simplicity of description, only a limited number of design points will be described hereinafter. However, this is not to be construed as limiting the invention since the number of design points DP generated by the circuit synthesizer can be on the order of thousands, millions, trillions, or more.

For each design point DP, an original cost OC is determined that is related to the degree of correlation between the performance specifications 6 for the circuit and the performances of the circuit topology associated with the design point. As used herein, the term "cost" means how good a design point is with respect to an optimal design point and/or another design point. The original cost OC of a design point can be determined in any manner known in the art that quantifies the "goodness" of the design point. For example, a ratio of each performance of a design point and its corresponding performance specification 6 can be formed. When a design point has a plurality of such ratios, they can be summed together to obtain the original cost. In another example, a normalized distance between each performance and its corresponding performance specification 6 can be determined. For example, if circuit 2 has a gain performance specification G of 50 dB and the actual gain performance $G_P$ is 60 dB, the normalized distance between G and $G_P$ is (60−50)/50 or 0.2. Once the normalized distance between each performance and its corresponding performance specification 6 has been determined, these distances can be summed together to obtain the original cost. Combinations of the foregoing techniques or any other suitable original cost determining technique(s) can be utilized.

With reference to FIGS. 4 and 5 and with ongoing reference to all previous figures, once an original cost OC has been determined for each design point DP, a subset of design points having the most favorable original costs associated therewith is identified and allocated to matrix 12. For example, if a design point having an original cost of one (1) indicates that the design point has optimal correspondence between its performances and the performance specifications 6 for the circuit, i.e., an optimal original cost, design points having original costs closest to one (1) will be more favorable than design points having original costs further away from one (1).

Once the optimal original cost has been determined for a circuit, design points having original costs closest to the optimal original cost are identified as having the most favorable original costs and these design points are allocated to matrix 12. To facilitate identifying this subset of design points, a threshold original cost value can be determined whereupon design points having original costs greater than this threshold original cost value can be deemed to have the most favorable original costs and design points having original costs less than this threshold original cost can be deemed to have less favorable original costs.

Once the subset of design points having the most favorable original costs is identified and allocated to matrix 12, a domination cost is determined for each identified or allocated design point. Generally speaking, a domination cost is a measure of how favorable at least one performance of each design point is with respect to the corresponding performance of at least one other design point. The domination cost of each design point can be determined in any suitable manner. Two techniques for determining the domination cost of each design point will now be described. However, the description of these two techniques is not to be construed as limiting the invention.

In a first technique for determining the domination cost of each identified design point, a determination is made for each identified design point of the number of identified design points that dominate it. One design point dominates another design point if and only if the one design point's specified performance goals are better than the corresponding performance goals of the other design point. For example, in FIG. 4 where the goal of each performance specification 6 is to maximize the value thereof, design point DP1 dominates design point DP2 since specified performances $G_{P\text{-}DP1}$ and $SR_{P\text{-}DP1}$ of design point DP1 are both greater than the corresponding performances of design point DP2. Similarly, design point DP3 dominates design point DP2. However, design point DP1 does not dominate design point DP3 since the gain performance $G_{P\text{-}DP1}$ of design point DP1 is less than the gain performance $G_{P\text{-}DP3}$ of design point DP3. Similarly, design point DP3 does not dominate design point DP1. If, however, the goal of each performance specification 6 in FIG. 4 was to minimize the value thereof, design point DP2 would dominate design points DP1 and DP3. However, design point DP1 would not dominate design point DP3 and vice versa.

Once the determination is made for each identified design point of how many other identified design points dominate it, the number of identified design points that dominate each identified design point is then divided by the total number of identified design points to determine the domination cost for the identified design point being evaluated. For example, in FIG. 5, if design points DP1–DP12 have been identified as having most favorable original costs, it can be seen that design points DP1, DP5, DP7, and DP8 are not dominated by any other design points. Hence, the domination cost of these design points is zero (0). However, as can be seen, design point DP2 is dominated by design points DP1 and DP5. Hence, the domination cost of design point DP2 is 2/12. Moreover, since design point DP4 is dominated by design points DP1, DP2, DP5, DP7, and DP10, the domination cost of design point 10 is 5/12. In a similar manner, the domination cost of each design point in FIG. 5 can be determined.

A second technique for determining the domination cost of each identified design point includes determining a "relative efficiency" of the identified design point. The determination of the relative efficiency of each identified design point will be described with reference to FIG. 6 which shows an x-y graph of a first performance specification 6 versus a second performance specification 6, where the intersection of the x-y axes defines a criteria point that represents the smallest (or largest) permissible values for the first and second performance specifications 6 and where the goal of each performance specification 6 is to maximize the value thereof.

Figure 6:
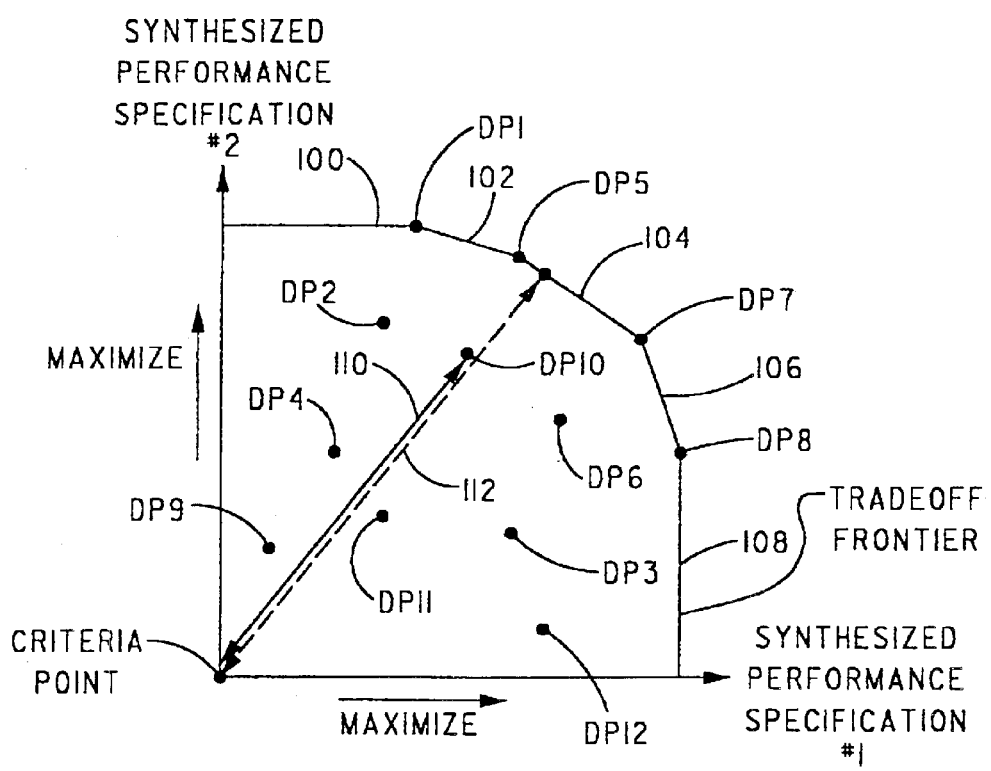

In FIG. 6, identified design points DP1, DP5, DP7, and DP8 define with respect to the criteria point a boundary, or tradeoff frontier, of design points DP1–DP12, which were identified as having most favorable original costs. In order to fully define the tradeoff frontier, identified design points DP1, DP5, DP7, and DP8 are joined in a piecewise linear fashion to each other and the x-y axes of the graph by lines 100–108. Once the tradeoff frontier has been defined by identified design points DP1, DP5, DP7, and DP8 and lines 100–108, the relative efficiency of each identified design point can be determined.

The determination of the relative efficiency of an identified design point will now be described with reference to identified design point DP10 in FIG. 6. A length of a line 110 that extends between the criteria point and design point DP10 is determined by application of the Pythagorean theorem. A length of a line 112 that extends from the criteria point, through design point DP10, to the tradeoff frontier is determined by application of the Pythagorean theorem. The relative efficiency of design point DP10 is then determined by dividing the length of line 110 by the length of line 112. The relative efficiency of the remaining identified design points in FIG. 6, i.e., DP1–DP9, DP11, and DP12, can be determined in a similar manner. It should be noted that since identified design points DP1, DP5, DP7, and DP8 define the tradeoff frontier, the relative efficiency of each of these design points is one (1).

Once the relative efficiency of each design point DP has been determined, this relative efficiency can be subtracted from the integer number one (1) to obtain the domination cost for the design point DP. For example, if the relative efficiency of design point DP10 is 0.75, the domination cost of design point DP10 is 0.25, i.e., 1–0.75.

Once the original cost OC and the domination cost DC for each design point DP has been determined, a tradeoff cost TC can be determined for the design point by summing the original cost OC plus the product of the domination cost DC times a weighting factor W, i.e., TC=OC+(W)DC. The weighting factor W is assigned a value whereupon the product of W(DC) has the same order of magnitude as OC.

In FIG. 6, the tradeoff frontier is defined by lines 100–108 connecting the x and y axes and design points DP1, DP5, DP7, and DP8. If, however, the determination of the relative efficiency of a design point DP involves consideration of three or more performances, an n-dimensional hypercurve, where n equals the number of performances being considered, can be formed to define the tradeoff frontier.

Figure 7:
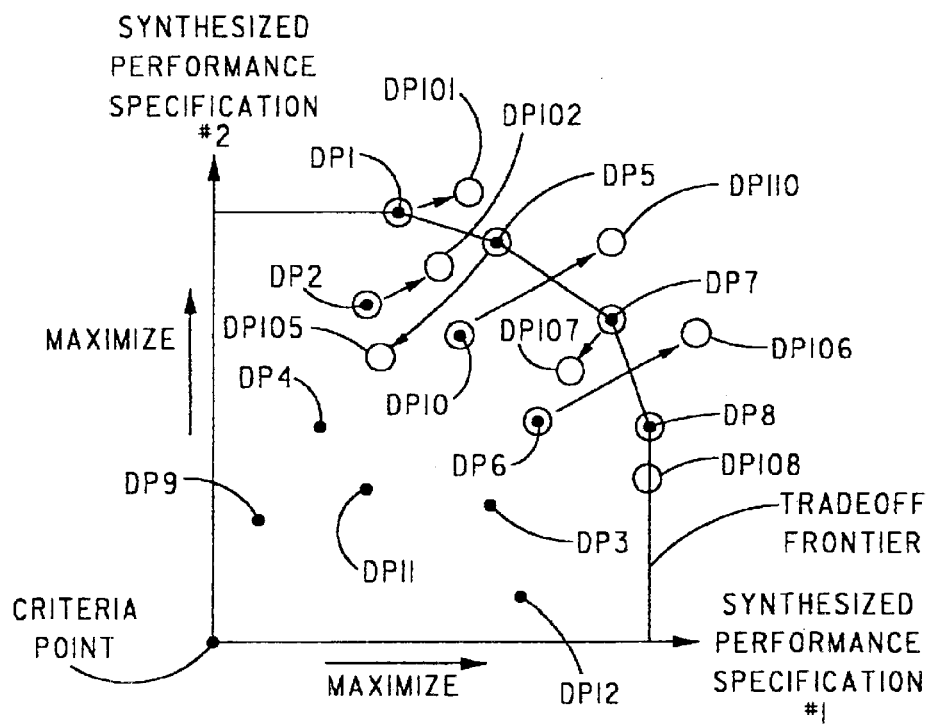
FIG. 7 is the x-y graph of FIG. 6 including a set of new design points generated from design points identified in FIG. 6 as having the most favorable (lowest) tradeoff costs.

With reference to FIG. 7 and with continuing reference to all previous figures, next, subject to performance specifications 6 and the circuit topology associated with each of a subset of the design points identified thus far, e.g., design points DP1–DP12, another new plurality of design points for the circuit is generated. This new plurality of design points is generated from the design points identified thus far that have the most favorable (lowest) tradeoff costs. In FIG. 7, the design points identified thus far are illustrated by a dot (•) and design points identified thus far that have the most favorable tradeoff costs are illustrated by a circled-dot (⊙). For example, each design point DP1, DP2, DP5, DP6, DP7, DP8, and DP10 identified as having the most favorable tradeoff cost is illustrated in FIG. 7 with a circled-dot (⊙). However, the identification of these design points is not to be construed as limiting the invention since the determination of what constitutes the most favorable tradeoff cost can be based on, among other things, a predetermined threshold value of tradeoff cost, the number of design points desired in the category of those having the most favorable tradeoff cost, or any other suitable criteria.

From the design points in FIG. 7 determined to have the most favorable tradeoff costs, the new plurality of design points for the circuit is generated. For example, new design points DP101, DP102, DP105, DP106, DP107, DP108, and DP110 are generated from design points DP1, DP2, DP5, DP6, DP7, DP8, and DP10, respectively. In order to generate these new design points, at least one device variable of each thus generated new design point is assigned a value that is different than the value of said device variable for the original, or parent, design point. For example, in order to generate design point DP101, one or more of the device variables associated with devices D1–D12 of circuit topology $T_{DP1}$ associated with design point DP1 are changed. When processed by the circuit synthesizer, these one or more changed device variables, along with the device constants, the performance specifications 6, and any device variables of circuit topology $T_{DP1}$ not changed, cause the circuit synthesizer to generate a circuit topology $T_{DP101}$ for design point DP101 along with the corresponding performances $G_{P\text{-}DP101}$, $SR_{P\text{-}DP101}$, . . . , $ETA_{P\text{-}DP101}$ for said circuit topology. In a similar manner, design points DP102, DP105, DP106, DP107, DP108, and DP110 are generated from design points DP2, DP5, DP6, DP7, DP8, and DP10, respectively. Once performances have been determined for the circuit topology associated with each new design point, an original cost, a domination cost, and a tradeoff cost can be determined for each new design point in the manner described above.

Each new design point that has a tradeoff cost that is the same or more favorable than the most favorable tradeoff cost determined thus far is identified and allocated to matrix 12. Stated differently, each new design point that is positioned on the tradeoff frontier or on a side of the tradeoff frontier opposite the criteria point is identified and allocated to matrix 12. In the example shown in FIG. 7, design points DP101, DP110, DP106 and DP108 have tradeoff costs that are the same or more favorable than the most favorable tradeoff costs determined thus far, i.e., the tradeoff costs that heretofore defined the tradeoff frontier. Hence, these design points are identified and allocated in matrix 12.

In addition, for the new design points having tradeoff costs that are less favorable than the most favorable tradeoff costs determined thus far, a subset of said design points are identified, utilizing a heuristic, and this subset of design points is allocated to matrix 12. For example, design points DP102, DP105, and DP107 have tradeoff costs that are less favorable than the most favorable tradeoff costs determined thus far. One suitable heuristic for identifying which of these new design points to include in matrix 12 includes a simulated annealing method. The simulated annealing method takes as input the tradeoff cost associated with the parent design point, e.g., $TC_{DP2}$, and the tradeoff costs associated with the corresponding new design point, e.g., $TC_{DP102}$. Based on these inputs, the simulated annealing method outputs an indication of whether the new design point should be identified as one to be allocated to matrix 12. If so, the new design point is allocated to matrix 12; otherwise, it is not so identified. The simulated annealing method is well-known in the art and will not be described herein in detail for simplicity of description.

Assuming design point DP102 is identified and allocated to matrix 12 and design points DP105 and DP107 are not so identified, matrix 12 will now include design point DP102; and design points DP101, DP110, DP106, and DP108, identified as having tradeoff costs that are the same or more favorable than the most favorable tradeoff costs that, prior to the generation of these new design points, defined the tradeoff frontier.

If it is desired to identify and allocate additional new design points to matrix 12, another subset of design points having the most favorable tradeoff costs is identifying from the design points already allocated to matrix 12. Thereafter, for each thus identified design point, the circuit synthesizer determines a new design point in the manner described above for design points DP101, DP102, DP105, DP106, DP107, DP108, and DP110. More specifically, for each thus identified design point, the circuit synthesizer determines a new circuit topology T based on a change of one or more device variables from the thus identified design point and determines the performances associated with said circuit topology whereupon the circuit topology T and the corresponding performances comprise the new design point. Once the performances for each new design point have been determined, the tradeoff cost for each new design point can be determined in the manner described above. Each thus determined new design point that has a tradeoff cost that is the same or more favorable than the most favorable tradeoff cost determined thus far is identified and allocated to matrix 12. Moreover, for the thus determined new design points having tradeoff costs that are less favorable than the most favorable tradeoff cost determined thus far, a subset of said design points can be identified and allocated matrix 12 based on the heuristic described above.

This process of identifying and allocating additional design points to matrix 12 can continue until a desired number of design points have been allocated thereto. If desired, during the process of identifying new design points to be allocated to matrix 12, the number of identified design points exceeds a threshold value, matrix 12 can be updated by eliminating design points having tradeoff costs below a threshold value.

Once a desired number of design points have been allocated to matrix 12, some or all of the allocated design points can be stored in a computer file for subsequent retrieval and display and/or displayed directly for selection by a designer of one of said allocated design points having desired performances. Desirably, the design points that are stored and/or displayed are those having a relative efficiency of one (1) and/or a domination cost of zero (0). However, this is not to be construed as limiting the invention.

With reference to FIG. 8 and with continuing reference to all previous figures, the selected design point DP can then be processed by a layout simulator (not shown) to produce a physical layout of circuit devices D subject to one or more layout constraints. This layout can also include the physical routing of interconnects 4 between circuit devices D, subject to one or more routing constraints, to facilitate proper operation of the circuit. Once the physical layout of circuit devices D and interconnects 4 is complete, a circuit simulator (not shown) can process the layout to determine the layout performances associated with the laid out circuit. If the thus determined layout performances are within a predetermined tolerance of layout performance specifications 14 for the laid out circuit, the laid out circuit can be deemed to be complete. The layout performance specification 14 for the laid out circuit can include some or all of the synthesized performance specifications 6 for the circuit prior to layout and can also include performance specifications, e.g., actual total area (ATA), yield estimate (YE), design rule compliance (DRC), and the like, unique to the laid out circuit.

If, however, the thus determined layout performances are not within the predetermined tolerance of the layout performance specifications, or if it is desired to have the layout performances more closely match the layout performance specifications, or if it is simply desired to generate a plurality of layout design points (LDPs), each of which has associated therewith a circuit layout instead of a circuit topology, such new layout design points LDPs can be generated from design points DP allocated to matrix 12 in the manner to be described next.

With reference to FIG. 9 and with continuing reference to all previous figures, to generate layout design points LDPs, one or more design points DP from matrix 12 having most favorable tradeoff costs TC associated therewith can be selected. Each of these selected design points DP are then processed by the layout simulator to produce a physical layout of the circuit devices D and the physical routing of the interconnects 4 between the circuit devices. For example, suppose design points DP1, DP5, DP7 and DP8 from matrix 12 are selected for processing by the layout simulator based on their having most favorable tradeoff costs. Processing design points DP1, DP5, DP7 and DP8 with the layout simulator produces layout design points LDP1, LDP5, LDP7 and LDP8 having circuit layouts $L_{LDP1}$, $L_{LDP5}$, $L_{LDP7}$ and $L_{LDP8}$, respectively. Once a circuit layout has been generated for each layout design point LDP, the circuit layout can be processed by a circuit simulator to determine for the circuit layout the layout performances therefor. FIG. 9 shows a layout design population matrix 16 where each row represents one of the layout design points LDPs determined from design points DP in matrix 12 having most favorable tradeoff costs associated therewith. For simplicity of description, only a limited number of layout design points LDPs will be described hereinafter. However, this is not to be construed as limiting the invention.

For each layout design point LDP that is part of matrix 16, an original cost OC is determined that is related to the degree of correlation between the performance specifications 14 for the layout design point LDP and the layout performances of the circuit layout associated with the layout design point. The original cost OC of a layout design point LDP can be determined in any suitable manner known in the art.

Next, a domination cost DC is determined for each layout design point LDP in any suitable manner, such as the first technique or the second technique discussed above for determining the domination cost for each design point allocated to matrix 12.

Once the original cost OC and the domination cost DC for each layout design point LDP has been determined, a tradeoff cost TC can be determined for the design point by summing the original cost OC plus the product of the domination cost DC times a weighting factor W, that has a value whereupon the product of W(DC) has the same order of magnitude as OC.

Figure 10:
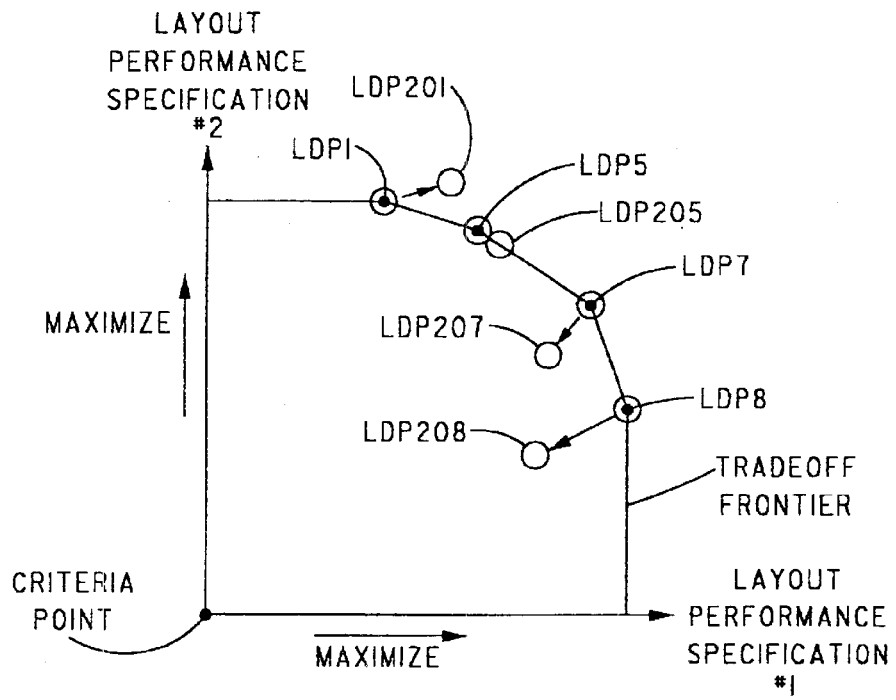
FIG. 10 is an x-y graph, where one axis represents one layout performance specification of a circuit and the other axis represents another layout performance specification of the circuit, including layout design points positioned in the graph, wherein each layout design point represents the performances for the layout design point corresponding to the layout performance specifications represented by the axes of the graph, and a set of new layout design points generated from the layout design points generated from design points with lowest tradeoff costs.

Next, subject to layout performance specifications 14 and the circuit layout associated with each of a subset of the layout design points LDPs allocated to matrix 16 thus far, another, new plurality of layout design points LDPs for the circuit is generated. In FIG. 10, the layout design points allocated to matrix 16 thus far are illustrated with a circled-dot (⊙).

From the layout design points in FIG. 10, new layout design points LDP201, LDP205, LDP207 and LDP208 are generated from design points LDP1, LDP5, LDP7 and LDP8, respectively. In order to generate these new design points, the layout associated with the parent layout design point is modified. For example, in order to generate layout design point LDP201, layout $L_{LDP1}$ associated with layout design point LDP1 is modified. The modification of each layout can be accomplished by relocating or reorienting one or more devices, or by relocating or rerouting one or more interconnects 4. Hence, layout design points LDP201, LDP205, LDP207 and LDP208 will have corresponding circuit layouts $L_{LDP201}$, $L_{LDP205}$, $L_{LDP207}$ and $L_{LDP208}$, respectively.

These new circuit layouts can then be processed by the circuit simulator to determine the layout performances therefor. For example, the circuit simulator can process circuit layout $L_{LDP201}$ to obtain layout performances $G_{P-LDP201}$, $SR_{P-LDP201}$, ..., $DRC_{P-LDP201}$. Once layout performances have been determined for the circuit layout associated with each new layout design point LDP, an original cost, a domination cost and a tradeoff cost can be determined for each new layout design point in the manner described above.

Each new layout design point LDP that has a tradeoff cost that is the same or more favorable than the most favorable tradeoff cost determined thus far is identified and allocated to matrix 16. Stated differently, each new layout design point LDP that is positioned on the tradeoff frontier shown in FIG. 10 or on a side thereof opposite the criteria point is identified and allocated to matrix 16. In the example shown in FIG. 10, layout design points LDP201 and LDP205 have tradeoff costs that are the same or more favorable than the most favorable tradeoff costs determined thus far, i.e., the tradeoff costs that heretofore defined the tradeoff frontier. Hence, these design points are identified and allocated to matrix 16.

In addition, for the layout design points having tradeoff costs that are less favorable than the most favorable tradeoff costs determined thus far, a subset of said design points is identified utilizing a heuristic and this subset of design points is allocated to matrix 16. For example, in FIG. 10, layout design points LDP207 and LDP208 have tradeoff costs that are less favorable than the most favorable tradeoff costs determined thus far. The suitable heuristic, e.g., simulated annealing method, outputs an indication of whether each new layout design points LDP207 and LDP208 should be identified as one to be allocated to matrix 16. If so, the new layout design point is identified and allocated to matrix 16; otherwise, it is not so identified.

Assuming layout design point LDP207 is identified and allocated to matrix 16, matrix 16 will now include layout design points LDP1, LDP5, LDP7, LDP8, LDP201, LDP205 and LDP 207.

If it is desired to identify and allocate additional new layout design points LDPs to matrix 16, another subset of layout design points having the most favorable tradeoff costs is identified from the layout design points already allocated to matrix 16. Thereafter, for each thus identified design point, a new circuit layout is generated from the thus identified layout design point LDP and the circuit simulator determines the layout performances associated with said circuit layout whereupon the circuit layout and the corresponding performances comprise the new layout design point LDP.

Once the performances for each new layout design point LDP have been determined, the tradeoff cost for each new layout design point can be determined in the manner described above. Each thus determined new layout design point LDP that has a tradeoff cost that is the same or more favorable than the most favorable tradeoff costs determined thus far is identified and allocated to matrix 16. Moreover, for the thus determined new layout design points LDPs having tradeoff costs that are less favorable than the most favorable tradeoff costs determined thus far, a subset of said design points can be identified and allocated to matrix 16 based on the heuristic described above.

The process of identifying and allocating additional layout design points LDPs to matrix 16 can continue until a desired number of layout design points LDPs has been allocated thereto. If desired, during the process of identifying new layout design points to be allocated to matrix 16 the number of identified layout design points exceeds the threshold value, matrix 16 can be updated by eliminating layout design points having tradeoff costs below a threshold value.

Once a desired number of layout design points has been allocated to matrix 16, some or all of the allocated layout design points can be stored in the computer file for subsequent retrieval and display and/or displayed directly for selection by a designer of one of said allocated layout design points having desired performances. Desirably, the layout design points are stored and/or displayed are those having a relative efficiency of one (1) and/or a domination cost of zero (0). However, this is not to be construed as limiting the invention.

As can be seen, the present invention is a method for generating and identifying high quality design points or layout design points as a function of one or more competing performances therefor.

The invention has been described with reference to the preferred embodiments. Obvious modifications and alterations will occur to others upon reading and understanding the preceding detailed description. For example, in FIG. 7, each new design point, e.g., design point DP101, was generated from a single design point, e.g., design point DP1. Alternatively, each new design point can be generated by combining two or more parent design points. For example, values of like device variables for two or more parent design points can be averaged to obtain new values for said device variables, which new values are then associated with a new design point. Based on these new values of device variables, the circuit synthesizer can determine a circuit topology T for the new design point and the performances associated with said circuit topology. Based on these new performances, a tradeoff cost for this new design point can be determined in the above described manner. It is intended that the invention be construed as including all such modifications and alterations insofar as they come within the scope of the appended claims or the equivalents thereof.

The invention claimed is:

1. A method of identifying high quality design points in a circuit design comprising:

(a) defining a plurality of performance specifications for a circuit formed from a plurality of interconnected circuit devices, wherein each performance specification represents a goal for a corresponding performance of the circuit;

(b) defining at least one device variable for at least one of the circuit devices;

(c) subject to each device variable and the performance specifications, generating a plurality of design points for the circuit, wherein each design point is comprised of a topology of the circuit devices and the performances associated with said topology;

(d) for each design point, determining an original cost that is related to the degree of correlation between the performance specifications and the performances of the circuit associated with said design point;

(e) identifying a subset of said design points;

(f) for each design point identified in step (e), determining a domination cost as a function of how favorable at least one performance of said design point is with respect to the corresponding performance of at least one other design point identified in step (e);

(g) for each design point identified in step (e), determining a tradeoff cost by combining the original cost and the domination cost for said design point;

(h) subject to the performance specifications and the circuit topology associated with each design point of a subset of the identified design points, generating another plurality of design points for the circuit, wherein each thus generated design point is generated from at least one of the subset of the identified design points, and at least one device variable of each thus generated design point has a value that is different than a value of said device variable for the at least one design point from which said thus generated design point was generated;

(i) for each design point generated in step (h), determining an original cost that is related to the degree of correlation between the performance specifications and the performances of the circuit associated with said design point;

(j) for each design point generated in step (h), determining a domination cost as a function of how favorable at least one performance of said design point is with respect to the corresponding performance of at least one other design point;

(k) for each design point generated in step (h), determining a tradeoff cost by combining the original cost and the domination cost for said design point;

(l) identifying each design point generated in step (h) that has a tradeoff cost that is the same or more favorable than the most favorable tradeoff cost determined before the preceding iteration of step (k); and (m) if identifying additional design points is desired, repeating steps (h) through (l).

2. The method of claim 1, further including:

(n) displaying a subset of the identified design points for selection of one of said identified design points having desired performances for the circuit.

3. The method of claim 2, wherein, in at least one of step (e), (h) and (n), the subset of design points or identified design point includes all of the design points or identified design points referenced in said step.

4. The method of claim 1, further including, between steps (k) and (m), for design points generated in step (h) that have tradeoff costs that are less favorable than the most favorable tradeoff cost determined before the preceding iteration of step (k), identifying a subset of said design points utilizing a heuristic.

5. The method of claim 4, wherein the heuristic includes utilizing a simulated annealing method to identify the subset of design points.

6. The method of claim 1, wherein the most favorable cost is the lowest cost.

7. The method of claim 1, wherein determining the domination cost in step (f) includes determining a ratio of:
    the total number of design points identified in step (e); and
    the number of design points identified in step (e) having at least two more favorable performances than said design point.

8. The method of claim 1, wherein determining the domination cost in step (f) includes determining a ratio of (1) a distance between at least two performances of said design point and a criteria point representing the smallest or largest permissible values of said two performances and (2) a distance between the criteria point and a tradeoff frontier defined by the other design point.

9. The method of claim 8, wherein determining the domination cost further includes subtracting said ratio from one (1).

10. The method of claim 8, wherein said at least two performances of said other design point are more favorable than said at least two performances of said design point.

11. The method of claim 10, wherein a performance of said one design point is more favorable than a corresponding performance of said other design point when a value of the performance of said one design point is closer to a value of the corresponding performance specification than the value of the performance of said other design point.

12. The method of claim 1, wherein determining the domination cost in step (j) includes determining a ratio of:
    a sum of the total number of identified design points plus the number of design points generated in step (h); and
    the number of design points of said sum having at least two more favorable performances than said design point.

13. The method of claim 1, wherein determining the domination cost in step (j) includes determining a ratio of (1) a distance between at least two performances of said design point and a criteria point representing the smallest or largest permissible values of said two performances and (2) a distance between the criteria point and a tradeoff frontier defined by the other design point.

14. The method of claim 13, wherein determining the domination cost further includes subtracting said ratio from one (1).

15. The method of claim 13, wherein said at least two performances of said other design point are more favorable than said at least two performances of said design point.

16. The method of claim 15, wherein a performance of said design point is more favorable than a corresponding performance of said other design point when a value of the performance of said design point is closer to a value of the corresponding performance specification than the value of the performance of said other design point.

17. The method of claim 1, wherein the subset of design points identified in step (e) are those having most favorable original costs associated therewith.

18. The method of claim 1, wherein, in step (h), each design point of the subset of identified design points is identified as a function of its tradeoff cost.

19. The method of claim 1, further including the steps of:

(aa) identifying a subset of the identified design points;

(bb) processing each design point identified in step (aa) to generate a layout design point that includes a physical layout of the interconnected circuit devices;

(cc) processing the physical layout of interconnected circuit devices associated with each layout design point generated in step (bb) to determine layout performances therefor;

(dd) determining a tradeoff cost for each layout design point generated in step (bb) that is related to at least one of (1) a degree of correlation between layout performance specifications for the circuit and the layout performances of the physical layout associated with said layout design point and (2) how favorable at least one layout performance of said layout design point is with respect to the corresponding layout performance of at least one other layout design point generated in step (bb);

(ee) identifying a subset of said layout design points;

(ff) generating another plurality of layout design points for the circuit, wherein each thus generated layout design point is generated from at least one of the identified layout design points, and a physical layout associated with each thus generated layout design point is different than the physical layout associated with the at least one identified layout design point from which said thus generated layout design point was generated;

(gg) processing the physical layout of interconnected circuit devices associated with each layout design point generated in step (ff) to determine layout performances therefor;

(hh) determining a tradeoff cost for each layout design point generated in step (ff) that is related to at least one of (1) a degree of correlation between the layout performance specifications and the layout performances of the physical layout associated with said layout design point and (2) how favorable at least one layout performance of said layout design point is with respect to the corresponding layout performance of at least one other layout design point;

(ii) identifying each layout design point generated in step (ff) that has a tradeoff cost that is the same or more favorable than the most favorable tradeoff cost determined before the preceding iteration of step (hh); and (jj) if identifying additional layout design points is desired, repeating steps (ff) through (ii).

20. The method of claim 19, further including, displaying a subset of the identified layout design points for selection of one of said layout design points having desired performances for the circuit.

21. The method of claim 19, further including, between steps (hh) and (jj), for layout design points generated in step (ff) that have tradeoff costs that are less favorable than the most favorable tradeoff cost determined before the preceding iteration of step (hh), identifying a subset of said layout design points utilizing a heuristic.

22. A computer readable medium having stored thereon instructions which, when executed by a processor, cause the processor to:

(a) generate a plurality of design points for a circuit based on at least one predefined performance specification for the circuit and at least one device variable for at least one circuit device of the circuit, wherein each design point is comprised of a topology of the circuit devices forming the circuit and performances of the circuit associated with said topology;

(b) determine for each design point an original cost that is related to the degree of correlation between the performance specifications and the performances of the circuit associated with said design point;

(c) allocate a subset of said design points to a design population;

(d) for each design point allocated in step (c), determine a domination cost as a function of how favorable at least one performance of said design point is with respect to the corresponding performance of at least one other design point allocated in step (c);

(e) for each design point allocated in step (c), determine a tradeoff cost by combining the original cost for said design point with the domination cost for said design point;

(f) subject to the performance specifications and the circuit topology associated with each design point of a subset of the design points allocated to the design population, generate another plurality of design points for the circuit, wherein each thus generated design point is generated from at least one of the design points allocated to the design population, and at least one device variable of each thus generated design point has a value that is different than a value of said device variable for the at least one design point from which said thus generated design point was generated;

(g) for each design point generated in step (f), determine an original cost that is related to the degree of correlation between the performance specifications and the performances of the circuit associated with said design point;

(h) for each design point generated in step (f), determine a domination cost as a function of how favorable at least one performance of said design point is with respect to the corresponding performance of at least one other design point;

(i) for each design point generated in step (f), determine a tradeoff cost by combining the original cost and the domination cost determined for said design point;

(j) for each design point generated in step (f) that has a tradeoff cost that is the same or more favorable than the most favorable tradeoff cost determined before the preceding iteration of step (i), allocate said design point to the design population; and (k) if allocation of additional design points to the design population is desired, repeat steps (f) through (j).

23. The computer readable medium of claim 22, wherein the instructions further cause the processor to:
- (l) cause a subset of the design points allocated to the design population to be displayed for selection of one of said allocated design points having desired performances for the circuit.

24. The computer readable medium of claim 23, wherein the subset of design points in at least one of steps (c), (f) and (l) includes all of the design points referenced in said step.

25. The computer readable medium of claim 22, wherein the instructions further cause the processor to, between steps (i) and (k), for the design points generated in step (f) that have tradeoff costs that are less favorable than the most favorable tradeoff cost determined before the preceding iteration of step (i), allocate a subset of said design points to the design population utilizing a heuristic.

26. The computer readable medium of claim 25, wherein the heuristic is a simulated annealing method.

27. The computer readable medium of claim 22, wherein the subset of design points allocated in step (c) are those having most favorable original costs associated therewith.

28. The computer readable medium of claim 22, wherein the instructions further cause the processor to:
- (aa) identify a subset of the design points allocated to the design population;
- (bb) process each design point identified in step (aa) to generate a layout design point that includes a physical layout of the interconnected circuit devices;
- (cc) process the physical layout of interconnected circuit devices associated with each layout design point generated in step (bb) to determine layout performances therefor;
- (dd) determine a cost for each layout design point generated in step (bb) that is related to at least one of (1) a degree of correlation between layout performance specifications and the layout performances of the physical layout associated with said layout design point and (2) how favorable at least one layout performance of said layout design point is with respect to the corresponding layout performance of at least one other layout design point generated in step (bb);
- (ee) allocate a subset of said layout design points to a layout design population;
- (ff) generate another plurality of layout design points for the circuit, wherein each thus generated layout design point is generated from at least one layout design point allocated to the layout design population, and a physical layout associated with each thus generated layout design point is different than the physical layout associated with the at least one layout design point from which said thus generated design point was generated;
- (gg) process the physical layout of interconnected circuit devices associated with each layout design point generated in step (ff) to determine layout performances therefor;
- (hh) determine a cost for each layout design point generated in step (ff) that is related to at least one of (1) a degree of correlation between the layout performance specifications for the circuit layout and the performances of the physical layout associated with said layout design point and (2) how favorable at least one layout performance of said layout design point is with respect to the corresponding layout performance of at least one other layout design point;
- (ii) for each layout design point generated in step (ff) that has a tradeoff cost that is the same or more favorable than the most favorable tradeoff cost determined before the preceding iteration of step (hh), allocate said layout design point to the layout design population; and
- (jj) if allocation of additional layout design points to the layout design population is desired, repeat steps (ff) through (ii).

29. The computer readable medium of claim 28, wherein the instructions further cause the processor to cause a subset of the layout design points allocated to the design population to be displayed for selection of one of said allocated layout design points having desired performances for the circuit.

30. The computer readable medium of claim 28, wherein the instructions further cause the processor to, between steps (hh) and (jj), for layout design points generated in step (ff) that have tradeoff costs that are less favorable than the most favorable tradeoff cost determined before the preceding iteration of step (hh), allocating a subset of said layout design points to the layout design population utilizing a heuristic.

31. A method of identifying high quality design points in a circuit design comprising:
- (a) generating a plurality of design points for a circuit based on at least one performance specification for the circuit and at least one device variable for at least one circuit device of the circuit, wherein each design point is comprised of a topology of the circuit devices forming the circuit and performances of the circuit associated with said topology;
- (b) allocating a subset of said design points to a design population;
- (c) for each allocated design point, determining a cost for said design point as a function of at least one of (1) a degree of correlation between the performance specifications and the performances of the circuit associated with said design point and (2) how favorable at least one performance of said design point is with respect to the corresponding performance of at least one other design point allocated in step (b);
- (d) subject to the performance specifications and the circuit topology associated with each design point of a subset of the design points allocated to the design population, generating another plurality of design points for the circuit, wherein each thus generated design point is generated from at least one of the design points allocated to the design population, and each thus generated design point has at least one device variable that has a value that is different than a value of said device variable for the at least one design point from which said thus generated design point was generated;
- (e) for each design point generated in step (d), determining a cost for said design point as a function of at least one of (1) a degree of correlation between the performance specifications and the performances of the circuit associated with said design point and (2) how favorable at least one performance of said design point is with respect to the corresponding performance of at least one other design point generated in step (d);
- (f) for each design point generated in step (d) that has a cost that is the same or more favorable than the most favorable cost determined before the preceding iteration of step (e), allocating said design point to the design population; and
- (g) repeating steps (d) through (f) if additional design points are to be allocated to the design population.

32. The method of claim 31, further including:
- (h) displaying a subset of the design points allocated to the design population for selection of one of said allocated design points having desired performances for the circuit.

33. The method of claim 32, wherein the subset of design points of at least one of steps (b), (d) and (h) includes all of the design points referenced in said step.

34. The method of claim 31, further including, between steps (e) and (g), for design points generated in step (d) that have costs that are less favorable than the most favorable cost determined before the preceding iteration of step (e), allocating a subset of said design points to the design population based on a heuristic.

35. The method of claim 34, wherein the heuristic is a simulated annealing method.

36. The method of claim 31, wherein the subset of design points allocated in step (b) are those having most favorable original costs associated therewith.

37. The method of claim 31, further including the steps of:

(aa) identifying a subset of the design points allocated to the design population thus far;

(bb) processing each design point identified in step (aa) to generate a layout design point that includes a physical layout of the interconnected circuit devices;

(cc) processing the physical layout of interconnected circuit devices associated with each layout design point generated in step (bb) to determine layout performances therefor;

(dd) determining a cost for each layout design point generated in step (bb) that is related to at least one of (1) a degree of correlation between layout performance specifications for the circuit and the layout performances of the physical layout associated with said layout design point and (2) how favorable at least one layout performance of said layout design point is with respect to the corresponding layout performance of at least one other layout design point generated in step (bb);

(ee) allocating a subset of said layout design points to a layout design population;

(ff) generating another plurality of layout design points for the circuit, wherein each thus generated layout design point is generated from at least one layout design point allocated to the layout design population, and a physical layout associated with each thus generated layout design point is different than the physical layout associated with the at least one layout design point from which said thus generated design point was generated;

(gg) processing the physical layout of interconnected circuit devices associated with each layout design point generated in step (ff) to determine layout performances therefor;

(hh) determining a cost for each layout design point generated in step (ff) that is related to at least one of (1) a degree of correlation between the layout performance specifications and the layout performances of the physical layout associated with said layout design point and (2) how favorable at least one layout performance of said layout design point is with respect to the corresponding layout performance of at least one other layout design point;

(ii) for each layout design point generated in step (ff) that has a tradeoff cost that is the same or more favorable than the most favorable tradeoff cost determined before the preceding iteration of step (hh), allocating said layout design point to the layout design population; and (jj) if allocation of additional layout design points to the design population is desired, repeat steps (ff) through (ii).

38. The method of claim 37, further including displaying a subset of the allocated layout design points for selection of one of said allocated layout design points having desired performances.

39. The method of claim 37, further including, before step (jj), for layout design points generated in step (ff) that have tradeoff costs that are less favorable than the most favorable tradeoff cost determined before the preceding iteration of step (hh), allocating a subset of said layout design points to the layout design population utilizing a heuristic.

* * * * *